United States Patent
Otsubo (10) Patent No.: US 10,674,648 B2
(45) Date of Patent: Jun. 2, 2020

(54) HIGH-FREQUENCY MODULE

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/414,185

(22) Filed: May 16, 2019

(65) Prior Publication Data
US 2019/0274237 A1 Sep. 5, 2019

Related U.S. Application Data

(63) Continuation of application No. PCT/JP2017/042965, filed on Nov. 30, 2017.

(30) Foreign Application Priority Data

Dec. 2, 2016 (JP) .................. 2016-235268

(51) Int. Cl.
| | |
|---|---|
| H05K 1/02 | (2006.01) |
| H05K 1/18 | (2006.01) |
| H05K 9/00 | (2006.01) |
| H01L 21/56 | (2006.01) |
| H01L 23/31 | (2006.01) |

(Continued)

(52) U.S. Cl.
CPC .......... H05K 9/0084 (2013.01); H01L 21/56 (2013.01); H01L 23/00 (2013.01); H01L 23/28 (2013.01);
(Continued)

(58) Field of Classification Search
CPC .. H05K 1/0216; H05K 1/0218; H05K 1/0219; H05K 1/185
See application file for complete search history.

(56) References Cited

U.S. PATENT DOCUMENTS

| | | | |
|---|---|---|---|
| 2008/0073747 A1* | 3/2008 | Chao | H01L 21/76 257/520 |
| 2012/0008288 A1* | 1/2012 | Tsukamoto | H05K 9/0037 361/736 |

(Continued)

FOREIGN PATENT DOCUMENTS

| | | |
|---|---|---|
| JP | 2010-114291 A | 5/2010 |
| JP | 2012-19091 A | 1/2012 |
| WO | 2016/181954 A1 | 11/2016 |

OTHER PUBLICATIONS

International Search Report for International Application No. PCT/JP2017/042965.

(Continued)

*Primary Examiner* — Hoa C Nguyen
(74) *Attorney, Agent, or Firm* — Pearne & Gordon LLP (57) ABSTRACT

Provided is a high-frequency module capable of improving a shielding performance for a specific component. In a high-frequency module 1a, a component 3c that is mounted on a top surface 20a of a multilayer wiring board 2 is surrounded by a shield film 6 coating a surface of a sealing-resin layer 4, a plurality of metallic pins 5a arranged in the sealing-resin layer 4 so as to surround the component 3c, an outer electrode 8c formed on a bottom surface 20b of the multilayer wiring board 2 so as to be located at a position that overlaps with the component 3c when viewed in a direction perpendicular to the top surface 20a of the multilayer wiring board 2, and a plurality of connection conductors (via conductors 10b and pad electrodes 11) connecting the metallic pins 5a and the outer electrode 8c to one another.

4 Claims, 7 Drawing Sheets

(51) Int. Cl.

| | |
|---|---|
| *H01L 23/00* | (2006.01) |
| *H01L 25/065* | (2006.01) |
| *H01L 25/00* | (2006.01) |
| *H05K 3/28* | (2006.01) |
| *H05K 3/40* | (2006.01) |
| *H01L 23/28* | (2006.01) |
| *H01L 23/552* | (2006.01) |

(52) U.S. Cl.
CPC ........ *H01L 23/3121* (2013.01); *H01L 23/552* (2013.01); *H01L 24/32* (2013.01); *H01L 24/48* (2013.01); *H01L 24/97* (2013.01); *H01L 25/0657* (2013.01); *H01L 25/50* (2013.01); *H05K 3/284* (2013.01); *H05K 3/40* (2013.01); *H01L 2224/32145* (2013.01); *H01L 2224/48227* (2013.01); *H01L 2924/181* (2013.01)

(56) References Cited

U.S. PATENT DOCUMENTS

| | | |
|---|---|---|
| 2012/0217048 A1 | 8/2012 | Leahy et al. |
| 2012/0228751 A1 | 9/2012 | Song |
| 2012/0292772 A1 | 11/2012 | Yorita et al. |
| 2015/0271959 A1* | 9/2015 | Chen .................... H05K 9/0024 361/760 |
| 2016/0095267 A1* | 3/2016 | Kitazaki .............. H05K 9/0024 361/760 |
| 2018/0092257 A1 | 3/2018 | Otsubo et al. |

OTHER PUBLICATIONS

Written Opinion for International Application No. PCT/JP2017/042965.

* cited by examiner

PRIOR ART

HIGH-FREQUENCY MODULE

This is a continuation of International Application No. PCT/JP2017/042965 filed on Nov. 30, 2017 which claims priority from Japanese Patent Application No. 2016-235268 filed on Dec. 2, 2016. The contents of these applications are incorporated herein by reference in their entireties.

BACKGROUND OF THE DISCLOSURE

Field of the Disclosure

The present disclosure relates to a high-frequency module that includes a shield.

Description of the Related Art

Figure 13:
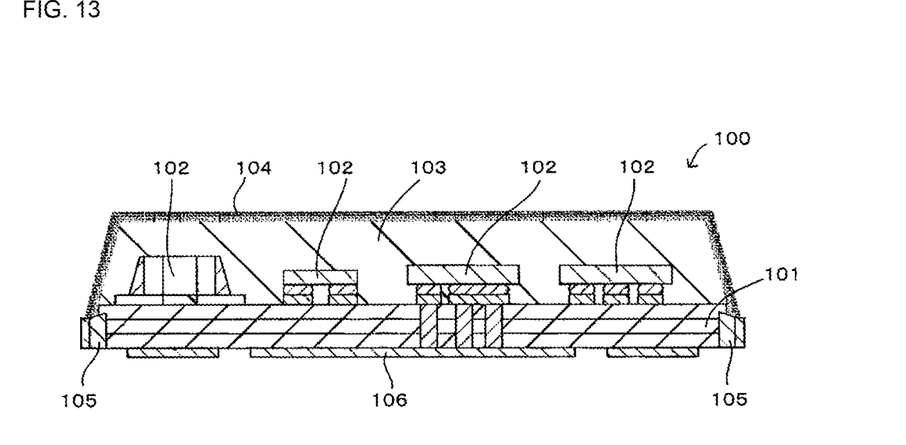
FIG. 13 is a sectional view of a high-frequency module of the related art.

An example of high frequency modules that are mounted on mobile terminal devices and so forth is a high-frequency module in which components mounted on a wiring board are sealed by a resin and in which a shield film is provided so as to coat a surface of the sealing-resin layer. For example, as illustrated in FIG. 13, in a high-frequency module 100 described in Patent Document 1, a plurality of components 102 are mounted on the top surface of a wiring board 101, and the components 102 are sealed by a sealing-resin layer 103. A shield film 104 is formed on a surface of the sealing-resin layer 103 by nickel plating. A through hole conductor 105 that is connected to an internal ground electrode is provided at an end portion of the wiring board, and the shield film 104 and the through hole conductor 105 are connected to each other. A ground electrode 106 is formed on the bottom surface of the wiring board 101.

Patent Document 1: Japanese Unexamined Patent Application Publication No. 2010-114291 (see [0054] to [0056], FIG. 1, and the like)

BRIEF SUMMARY OF THE DISCLOSURE

In recent years, there has been a demand for further improvement in the shielding characteristics of this type of high-frequency module. In the above-described high-frequency module 100, there is no shield between the components 102 mounted on the wiring board 101, and mutual noise interference between the components 102 cannot be prevented. In addition, although the ground electrode 106 that functions as a shield is formed on the bottom surface of the wiring board 101, the components 102 are not completely surrounded by the shield and are discontinuously surrounded by the shield, and thus, noise entering from a region between the ground electrode 106 and another electrode that is formed on the bottom surface of the wiring board 101 cannot be prevented from affecting the components 102 and the like.

The present disclosure has been made in view of the above-described problem, and it is an object of the present disclosure to provide a high-frequency module capable of improving a shielding performance for a specific component.

To achieve the above-described object, a high-frequency module according to the present disclosure includes a wiring board, a plurality of components that are mounted on a first main surface of the wiring board, a sealing-resin layer that seals the first main surface of the wiring board and the plurality of components, a shield member that is disposed in the sealing-resin layer so as to be located between one of the plurality of components and the other components, a shield film that coats a surface of the sealing-resin layer, the surface being opposite to a surface of the sealing-resin layer that is in contact with the wiring board, a side surface of the sealing-resin layer, and a side surface of the wiring board, a shield electrode that is disposed at a position on a second main surface of the wiring board that is opposite to the first main surface of the wiring board, the position overlapping with the one component when viewed in a direction perpendicular to the first main surface of the wiring board, and a plurality of connection conductors that are disposed in or on the wiring board and that connect the shield member and the shield electrode to each other. A first end of the shield member in a thickness direction of the wiring board is connected to the shield film, and a second end of the shield member in the thickness direction of the wiring board is connected to the first main surface of the wiring board. The one component is surrounded by the shield film, the shield member, the shield electrode, and the plurality of connection conductors.

With this configuration, the one component is surrounded by the shield film, the shield member, the shield electrode, and the plurality of connection conductors, and thus, not only the interference of noise from the first main surface of the wiring board but also the interference of noise from the second main surface of the wiring board can be prevented. In addition, among the plurality of components mounted on the wiring board, the mutual noise interference between the one component and the other components can be prevented. Furthermore, in the case where the shield electrode is disposed on the second main surface of the wiring board, the length of a connection wiring line (connection conductor) between the shield member and the ground electrode can be reduced by connecting the shield electrode to a ground electrode of an external mother substrate. Thus, the connection resistance between the shield member and a ground electrode for grounding can be reduced.

In addition, a portion of an end edge of the shield electrode may be located at an end edge of the second main surface of the wiring board so as to be connected to the shield film at the end edge of the second main surface of the wiring board. The shield member may be disposed so as to surround the one component together with a portion of the shield film that coats the side surface of the sealing-resin layer when viewed in the direction perpendicular to the first main surface of the wiring board. The plurality of connection conductors may be arranged along the shield member when viewed in the direction perpendicular to the first main surface of the wiring board.

With this configuration, for example, when the one component is disposed at an end edge portion of the first main surface of the wiring board, a portion of the shield film that coats a side surface of the sealing-resin layer can also contribute to a shielding function. In addition, since the shield electrode is disposed on the second main surface of the wiring board, the shielding characteristics for a wiring pattern that is formed in the wiring board can be improved. Furthermore, the shield electrode can be used as a land for heat dissipation.

In addition, the shield member may be disposed so as to surround the one component when viewed in the direction perpendicular to the first main surface of the wiring board. The shield electrode may be disposed in a region that overlaps with the one component when viewed in the direction perpendicular to the first main surface of the wiring board.

With this configuration, for example, when the one component is disposed on a center portion of the first main surface of the wiring board, the mutual noise interference between the one component and the other components can be prevented by surrounding the one component by using a shield member between the components. In addition, since the shield electrode is disposed on the second main surface of the wiring board, the shielding characteristics of a wiring pattern that is formed in the wiring board can be improved. Furthermore, the shield electrode can be used as a land for heat dissipation.

In addition, the shield electrode may be disposed in the wiring board so as to be positioned closer to the second main surface than a center of the wiring board is in the thickness direction of the wiring board.

With this configuration, a configuration in which the shield electrode formed in the wiring board is used when a shield surrounds the one component can be provided.

According to the present disclosure, one of a plurality of components is surrounded by a shield film, a shield member, a shield electrode, and a plurality of connection conductors, and thus, not only the interference of noise from a first main surface of a wiring board, but also the interference of noise from a second main surface of the wiring board can be prevented. In addition, among the plurality of components that are mounted on the wiring board, the mutual noise interference between the one component and the other components can be prevented by surrounding the one component by using a shield member between the components.

BRIEF DESCRIPTION OF THE SEVERAL VIEWS OF THE DRAWINGS

Each of FIGS. 7A and 7b is a diagram illustrating a modification of outer electrodes of the high-frequency module illustrated in FIG. 3.

DETAILED DESCRIPTION OF THE DISCLOSURE

First Embodiment

A high-frequency module 1a according to a first embodiment of the present disclosure will be described with reference to FIG. 1 and FIG. 2. Note that FIG. 1 is a sectional view of the high-frequency module, and FIG. 2 is a bottom view of the high-frequency module 1a.

Figure 1:
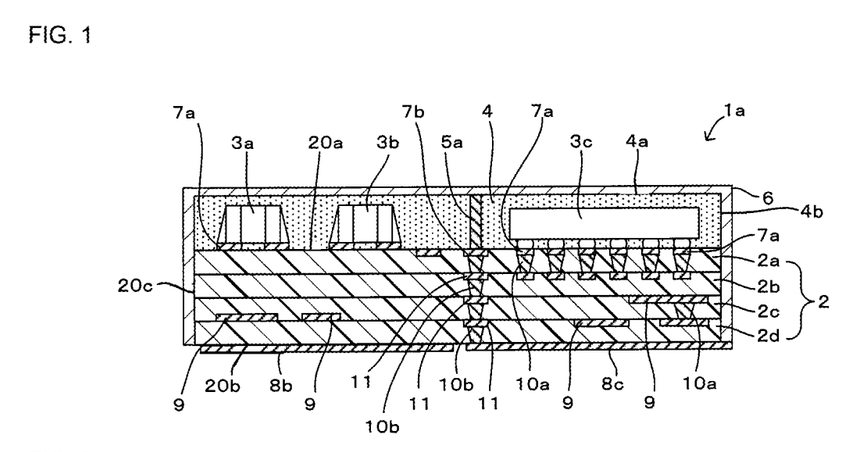
FIG. 1 is a sectional view of a high-frequency module according to a first embodiment of the present disclosure.
Figure 2:
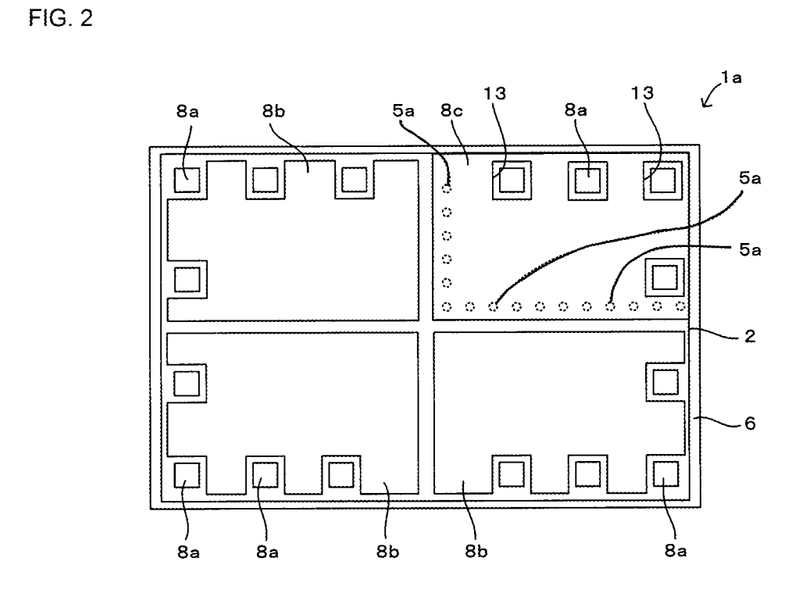
FIG. 2 is a bottom view of the high-frequency module illustrated in FIG. 1.

As illustrated in FIG. 1 and FIG. 2, the high-frequency module 1a according to the first embodiment includes a multilayer wiring board 2 (corresponding to a "wiring board" according to the present disclosure), a plurality of components 3a to 3c that are mounted on a top surface 20a of the multilayer wiring board 2, a sealing-resin layer 4 that is laminated on the top surface 20a of the multilayer wiring board 2, a shield film 6 that coats a surface of the sealing-resin layer 4, and a plurality of metallic pins 5a that are formed so as to isolate the component 3c from the other components 3a and 3b in the sealing-resin layer 4. For example, the high-frequency module 1a is mounted on a mother substrate of an electronic device that uses a high-frequency signal.

The multilayer wiring board 2 is formed by, for example, laminating a plurality of insulating layers 2a to 2d that are formed of a low-temperature co-fired ceramic, a glass epoxy resin, or the like. Mount electrodes 7a for mounting the components 3a to 3c and mount electrodes 7b for mounting the metallic pins 5a (each corresponding to a "shield member" according to the present disclosure) are formed in or on the top surface 20a of the multilayer wiring board 2 (corresponding to a "first main surface of the wiring board" according to the present disclosure). A plurality of outer electrodes 8a to 8c for external connection are formed on a bottom surface 20b of the multilayer wiring board 2 (corresponding to a "second main surface of the wiring board" according to the present disclosure). In addition, various internal wiring electrodes 9 are formed between the adjacent insulating layers 2a to 2d, and a plurality of via conductors 10a are formed in the multilayer wiring board 2 so as to connect the internal wiring electrodes 9 formed at the different insulating layers 2a to 2d to one another.

The mount electrodes 7b for mounting the metallic pins 5a and the outer electrode 8c (corresponding to a "shield electrode" according to the present disclosure) are connected to one another by pad electrodes 11 and via conductors 10b that are formed in the multilayer wiring board 2. The outer electrode 8c is formed so as to have an area larger than that of the component 3c when viewed in a direction perpendicular to the top surface 20a of the multilayer wiring board 2 and is formed such that the component 3c is fitted into the outer electrode 8c when viewed in this direction.

The pad electrodes 11 and the via conductors 10b are alternately arranged in a thickness direction of the multilayer wiring board 2. The pad electrodes 11 and the via conductors 10b, which are alternately arranged, are disposed at positions overlapping with the mount electrodes 7b, which are connected thereto, when viewed in the direction perpendicular to the top surface 20a of the multilayer wiring board 2. In other words, the metallic pins 5a are linearly connected to the outer electrode 8c in the direction perpendicular to the top surface 20a of the multilayer wiring board 2 via the plurality of via conductors 10b and the plurality of pad electrodes 11. Here, a set of one of the plurality of pad electrodes 11 and one of the plurality of via conductors 10b connecting one of the mount electrodes 7b and the outer electrode 8c to each other will sometimes be referred to as a connection conductor.

Note that the configuration of each of the connection conductors is not limited to that described above, and each of the connection conductors may be formed by, for example, connecting only the plurality of via conductors 10b to each other without forming the pad electrodes 11. In addition, each of the metallic pins 5a does not need to be linearly connected to the outer electrode 8c, and the mount electrodes 7b may at least be connected to the outer electrode 8c via wiring electrodes formed in or on main surfaces of the insulating layers 2a to 2d and a plurality of via conductors that extend through the insulating layers 2a to 2d.

As illustrated in FIG. 2, the outer electrode 8c is formed to have an external shape that is a horizontally long rectangular shape, and a pair of short and long sides thereof that are adjacent to each other are positioned so as to substantially overlap with an end edge of the bottom surface 20b of the multilayer wiring board 2. The outer electrode 8c and the shield film 6 (a portion of the shield film 6 that coats a side surface 20c of the multilayer wiring board 2) are connected to each other at this overlapping position. The metallic pins 5a are arranged along the other pair of short and long sides of the outer electrode 8c that do not overlap with the end edge of the bottom surface 20b of the multilayer wiring board 2 when viewed in a direction perpendicular to the top surface 20a (or the bottom surface 20b) of the multilayer wiring board 2. In this case, the component 3c is surrounded by a portion of the shield film 6 that coats a side surface 4b of the sealing-resin layer 4 and the plurality of metallic pins 5a when viewed in the direction perpendicular to the top surface 20a (or the bottom surface 20b) of the multilayer wiring board 2. In addition, the outer electrode 8c has openings 13 in which the other outer electrodes 8a are to be arranged. However, the openings 13 do not need to be formed in the case where outer electrodes are not necessary.

According to such an array of the metallic pins 5a, the connection conductors are also arranged along the other pair of short and long sides when viewed in the direction perpendicular to the top surface 20a (or the bottom surface 20b) of the multilayer wiring board 2. Note that it is preferable that the distance between the adjacent metallic pins 5a and the distance between the adjacent connection conductors be equal to or less than ¼ λ (wave length) of a wave length in a resin mold substrate at a predetermined maximum usable frequency. When the metallic pins 5a are arranged in such a way, the function of each of the metallic pins 5a serving as a shield can be improved. Note that the metallic pins may be arranged so as to be in contact with one another.

The upper end surfaces of the metallic pins 5a are exposed at a top surface 4a of the sealing-resin layer 4 and connected to the shield film 6, and the lower end surfaces of the metallic pins 5a are connected to the mount electrodes 7b. The metallic pins 5a are arranged so as to isolate the component 3c from the other components 3a and 3b, that is, the metallic pins 5a are arranged between the component 3c and the other components 3a and 3b so as to function as a shield wall that prevents the mutual noise interference between the component 3c and the other components 3a and 3b. Note that each of the metallic pins 5a is formed by, for example, shearing a wire member that is formed of a metallic member, which is made of, for example, Cu, Au, Ag, Al, or a Cu-based alloy and which is generally employed as a wiring electrode. In addition, in the present embodiment, the metallic pins 5a are each formed in a columnar shape so as to have approximately the same thickness and length.

With this configuration, the component 3c is surrounded by the shield film 6, the metallic pins 5a, the connection conductors (the via conductors 10b and the pad electrodes 11), and the outer electrode 8c. Each of the outer electrodes 8a to 8c is connected to a mount electrode of a mother substrate with solder or the like, and the outer electrode 8c, which is connected to the metallic pins 5a, and the outer electrodes 8b, which are different from the outer electrode 8c, are connected to mount the electrodes of the mother substrate that are used for grounding. With such a configuration, the shield film 6, the metallic pins 5a, the connecting electrodes (the via conductors 10b and the pad electrodes 11), and the outer electrode 8c are all grounded, and the shielding characteristics for the component 3c is ensured. In addition, the outer electrodes 8b are also grounded, so that the outer electrodes 8b each function as a shield on the side on which the bottom surface 20b of the multilayer wiring board 2 is present. Furthermore, the heat-dissipation performance of the multilayer wiring board 2 is improved.

Note that the mount electrodes 7a and 7b, the outer electrodes 8a to 8c, and the internal wiring electrodes 9 are each made of a metal such as Cu, Ag, or Al that is generally used as a wiring electrode. The via conductors 10a, 10b are each made of a metal such as Ag or Cu. Note that nickel plating and gold plating may be performed on the mount electrodes 7a and 7b and the outer electrodes 8a to 8c.

Each of the components 3a to 3c is formed of a semiconductor device made of a semiconductor such as Si or GaAs or a chip component such as a chip inductor, a chip capacitor, a chip resistor and is mounted on the multilayer wiring board 2 by a common surface mount technology such as solder joint. Note that, in the present embodiment, the component 3c, which is surrounded by the shield film 6, the metallic pins 5a, the outer electrode 8c, and the connection conductors, is formed of a semiconductor device in which there is a possibility that a defect, such as a malfunction, will occur due to the influence of noise.

The sealing-resin layer 4 is laminated on the multilayer wiring board 2 so as to coat the top surface 20a of the multilayer wiring board 2, the components 3a to 3c, and the metallic pins 5a. The sealing-resin layer 4 can be made of a resin such as an epoxy resin that is generally used as a sealing resin.

The shield film 6 shields the internal wiring electrodes 9 and the components 3a to 3c in the multilayer wiring board 2 against the noise from the outside and is laminated on the sealing-resin layer 4 so as to coat the top surface 4a and the side surface 4b of the sealing-resin layer 4 and the side surface 20c of the multilayer wiring board 2.

The shield film 6 can be formed so as to have a multilayer structure including a close-contact film that is laminated on the surface of the sealing-resin layer 4, an electroconductive film that is laminated on the close-contact film, and a protective film that is laminated on the electroconductive film.

The close-contact film is provided in order to improve the adhesion strength between the electroconductive film and the sealing-resin layer 4 and can be made of, for example, a metallic material such as SUS. The electroconductive film is a layer that serves a substantial shielding function of the shield film 6 and can be made of, for example, one of metals, which are Cu, Ag, and Al. The protective film is provided in order to prevent the corrosion of the electroconductive film and the formation of scratches on the electroconductive film and can be made of, for example, SUS.

According to the above-described embodiment, since the component 3c is surrounded by the shield film 6, the metallic pins 5a, the outer electrode 8c, and the plurality of connection conductors (the via conductors 10b and the pad electrodes 11), not only interference of noise from the top surface 20a of the multilayer wiring board 2, but also interference of noise from the bottom surface 20b of the multilayer wiring board 2 can be prevented. In addition, since the plurality of metallic pins 5a are arranged so as to isolate the component 3c from the other components 3a and 3b, mutual noise interference between the component 3c and the other components 3a and 3b can be prevented.

In the high-frequency module 1a, a region that is surrounded by the shield film 6, the metallic pins 5a, the outer electrode 8c, and the plurality of connection conductors (the via conductors 10b and the pad electrodes 11) can be shielded against noise from the outside, and thus, the shielding characteristics for the internal wiring electrodes 9 in the region can also be improved.

By linearly connecting the shield film 6 and the outer electrode 8c, which is connected to one of the mount electrodes of the mother substrate used for grounding, to each other via the metallic pins 5a and the connection conductors (the via conductors 10b and the pad electrodes 11), the shield film 6 and a ground electrode of the mother substrate can be connected to each other at a short distance. In this case, the connection resistance between the shield film 6 and the ground electrode of the mother substrate can be reduced, and the shielding performances for the component 3c and so forth that are arranged in the region surrounded by the shield film 6, the metallic pins 5a, the outer electrode 8c, and the plurality of connection conductors (the via conductors 10b and the pad electrodes 11) can be improved.

The outer electrodes 8b and 8c excluding the outer electrodes 8a, which are arranged on the end edge portions of the bottom surface 20b of the multilayer wiring board 2, are each formed so as to have an area larger than that of each of the outer electrodes 8a, and these outer electrodes 8b and 8c can also be used as lands for heat dissipation.

Second Embodiment

A high-frequency module 1b according to a second embodiment of the present disclosure will be described with reference to FIG. 3 and FIG. 4. Note that FIG. 3 is a sectional view of the high-frequency module 1b, and FIG. 4 is a bottom view of the high-frequency module 1b.

Figure 3:
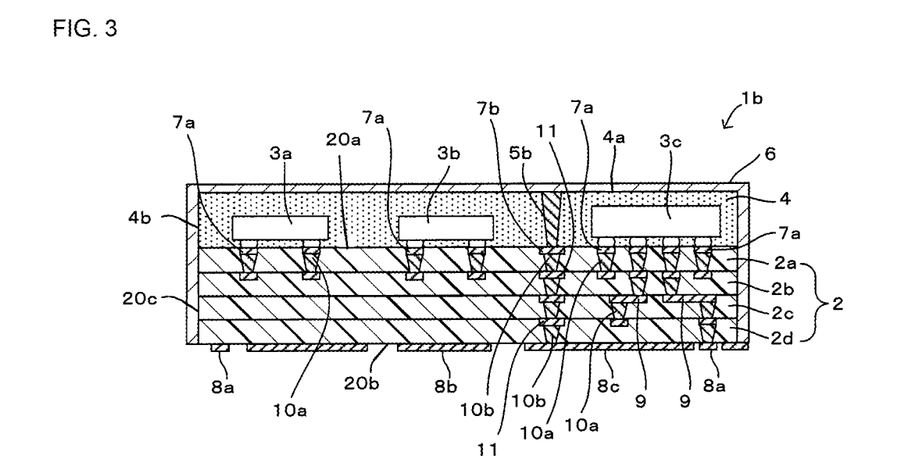
FIG. 3 is a sectional view of a high-frequency module according to a second embodiment of the present disclosure.
Figure 4:
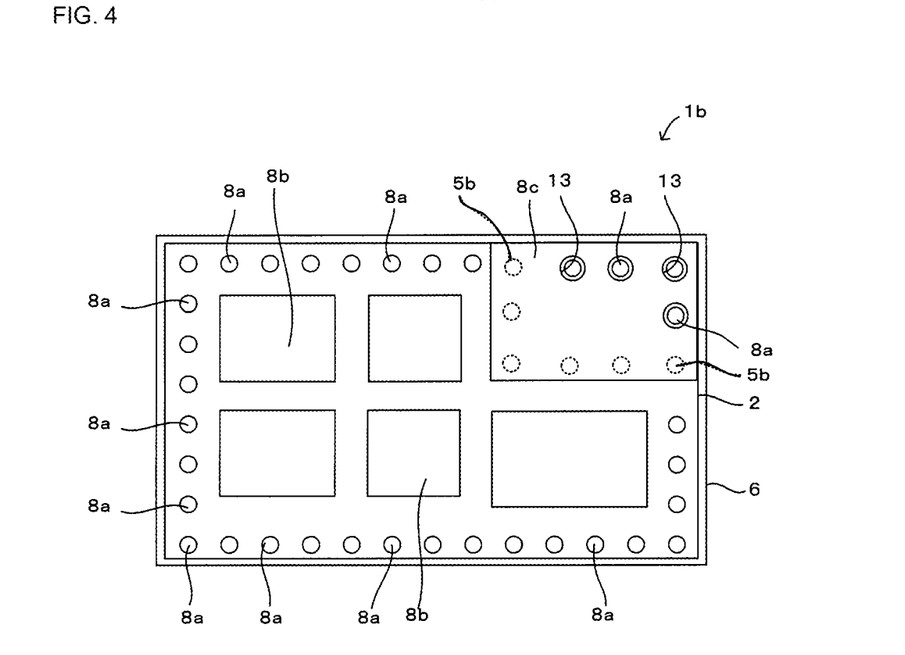
FIG. 4 is a bottom view of the high-frequency module illustrated in FIG. 3.

The differences between the high-frequency module 1b according to the second embodiment and the high-frequency module 1a according to the first embodiment that has been described with reference to FIG. 1 and FIG. 2 are, as illustrated in FIG. 3 and FIG. 4, the shield structures between the components 3a to 3c mounted on the multilayer wiring board 2 and the outer electrodes are formed on the bottom surface 20b of the multilayer wiring board 2. The rest of the configuration of the high-frequency module 1b is the same as that of the high-frequency module 1a according to the first embodiment, and thus, the same reference signs will be used, and the description thereof will be omitted.

Although a portion that functions as a shield between components is formed of the metallic pins 5a in the first embodiment, a portion that functions as a shield between components is formed of a plurality of via conductors 5b in the second embodiment. As illustrated in FIG. 4, the via conductors 5b are arranged along a pair of short and long sides of the outer electrode 8c. Note that the via conductors 5b can be formed by forming a plurality of via holes each of which extends through the sealing-resin layer 4 and injecting an electrically conductive paste into the via holes or performing via-filling plating such that the mount electrodes 7b are exposed at the top surface 4a of the sealing-resin layer 4.

Among the outer electrodes 8a to 8c, which are formed on the bottom surface 20b of the multilayer wiring board 2, the outer electrodes 8a that are arranged on the end edge portions of the bottom surface 20b are each formed in a circular shape. Accordingly, each of the openings 13 of the outer electrode 8c is also formed in a circular shape that has a diameter slightly larger than that of each of the outer electrodes 8a.

According to the second embodiment, advantageous effects similar to those of the high-frequency module 1a according to the first embodiment can be obtained. In addition, a portion of the shield surrounding the component 3c, the portion functioning as the shield between the components, can be formed by using the via conductors 5b.

(Modification of Shield Member)

Figure 5:
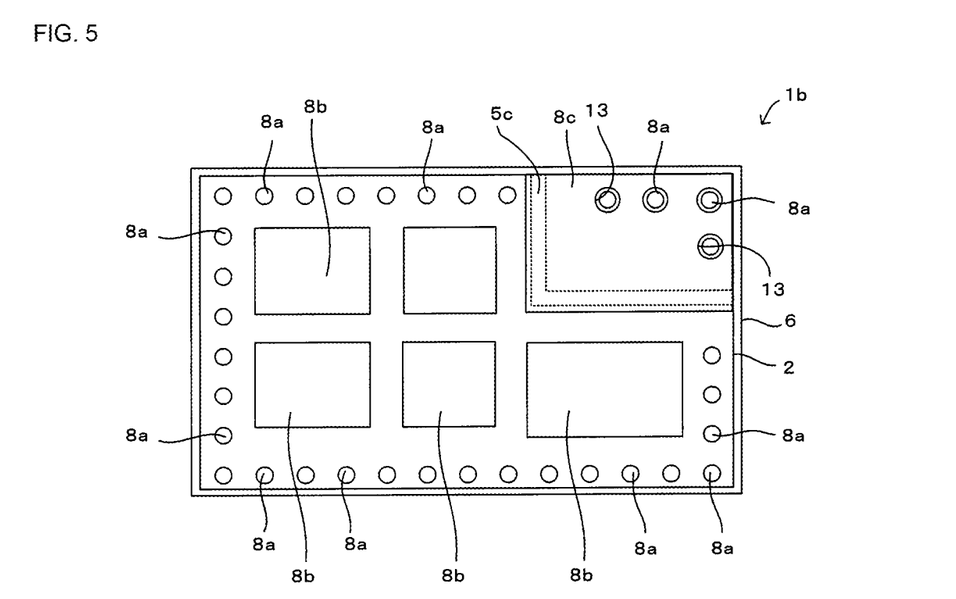
FIG. 5 is a diagram illustrating a modification of a shield between components of the high-frequency module illustrated in FIG. 3.

In the above-described second embodiment, a portion of the shield surrounding the component 3c, the portion functioning as the shield between the components, is formed of the via conductors 5b. However, as illustrated in FIG. 5, this portion may be formed as a single shield wall 5c. In this case, the shield wall 5c can be formed by, for example, forming a groove extending along a pair of short and long sides of the outer electrode 8c and injecting an electrically conductive paste into the groove or filling in the groove when the shield film 6 is formed. With this configuration, the gaps between the via conductors 5b are eliminated as in the second embodiment, and thus, the shielding characteristics are further improved. Note that, in this case, the shield wall 5c and the outer electrode 8c are connected to each other by the plurality of connection conductors (the plurality of via conductors 10b and the plurality of pad electrodes 11) each extending through the multilayer wiring board 2 in the thickness direction of the multilayer wiring board 2. In this case, the connection conductors may be arranged at a predetermined pitch such that the adjacent connection conductors are not connected to each other. It is preferable that the predetermined pitch be equal to or less than ¼λ (wave length) of a wave length in the multilayer wiring board 2 at a predetermined maximum usable frequency.

(Modification of Internal Wiring Electrode)

Figure 6:
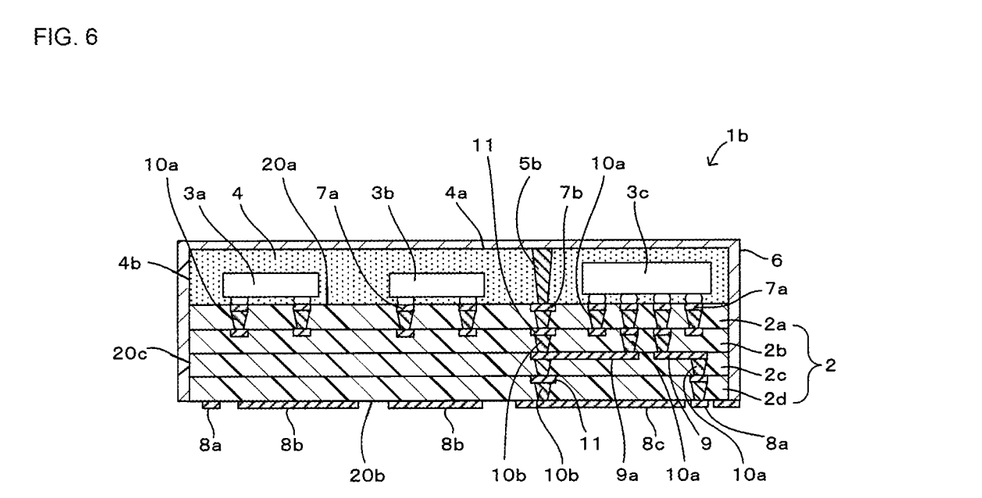
FIG. 6 is a diagram illustrating a modification of an internal wiring structure of the high-frequency module illustrated in FIG. 3.

As illustrated in FIG. 6, in the second embodiment, among signal lines of the component 3c that are formed in or on the multilayer wiring board 2, the signal line for grounding may be connected to at least one of the connection conductors (the via conductors 10b and the pad electrodes 11). In this case, one of the internal wiring electrodes 9a that is included in the grounding signal line is connected to the pad electrode 11 of one of the connection conductors that is formed in or on the insulating layer 2c in or on which the internal wiring electrode 9a is also formed. With this configuration, it is not necessary to extend the grounding signal line of the component 3c to an outer electrode on the bottom surface 20b of the multilayer wiring board 2, and thus, the degree of freedom when designing wiring lines in the multilayer wiring board 2 increases. In addition, the area of a region in which a ground electrode is formed in the multilayer wiring board 2 can be reduced.

(Modification of Outer Electrode)

Figure 7A:
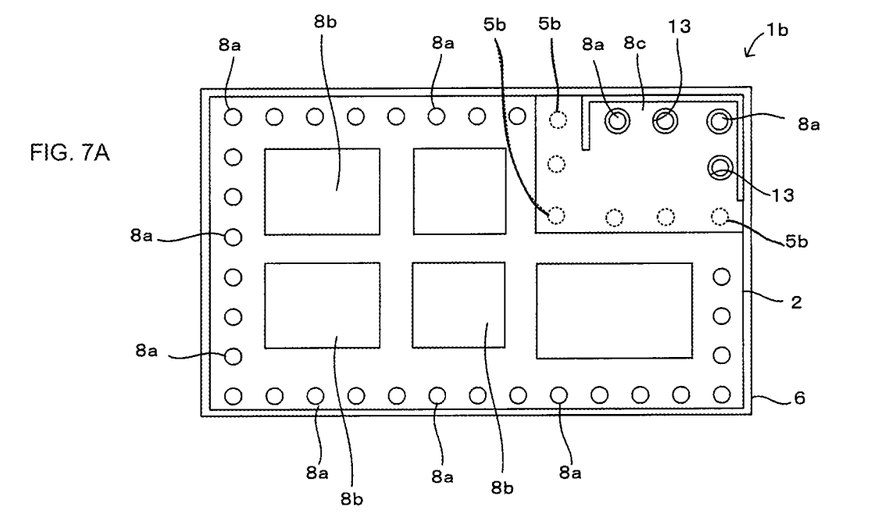
Figure 7B:
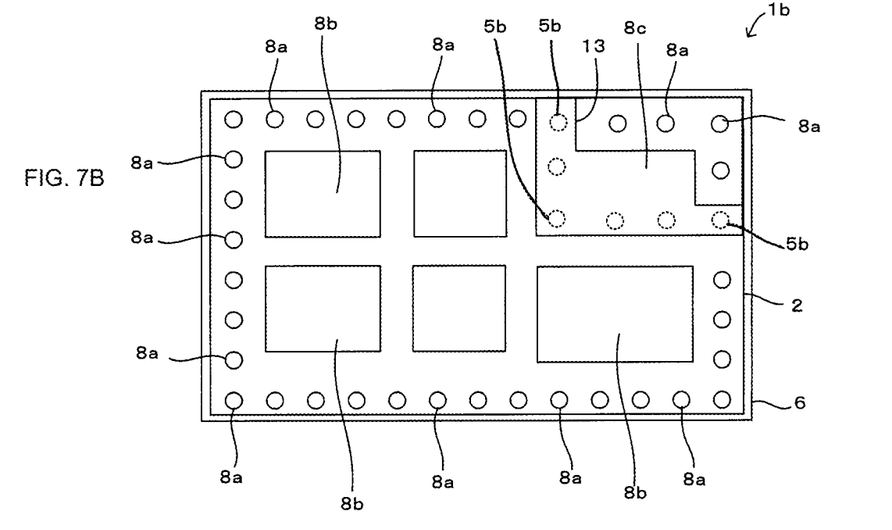

As illustrated in FIGS. 7A and 7B, the shape of the outer electrode 8c forming a portion of the shield is not limited to a rectangular shape and can be suitably changed. For example, the external shape of the outer electrode 8c according to the second embodiment is a rectangular shape, and a pair of short and long sides of the outer electrode 8c are positioned so as to overlap with an end edge of the bottom surface 20b of the multilayer wiring board 2. However, as illustrated in FIG. 7A, the outer electrode 8c may have a shape such that there are gaps between the portions of the end edges of the outer electrode 8c, the portions being in the vicinity of the openings 13 for the outer electrodes 8a, and the end edges of the bottom surface 20b of the multilayer wiring board 2. In addition, in the outer electrode 8c according to the second embodiment, although the openings 13 are formed for the individual outer electrodes 8a, a single opening 13 having an L shape may be formed as illustrated in FIG. 7B, and all the outer electrodes 8a that are to be arranged in the opening 13 may be arranged in the opening 13.

Third Embodiment

A high-frequency module 1c according to a third embodiment of the present disclosure will be described with reference to FIG. 8 and FIG. 9. Note that FIG. 8 is a sectional view of the high-frequency module 1c, and FIG. 9 is a bottom view of the high-frequency module 1c.

Figure 8:
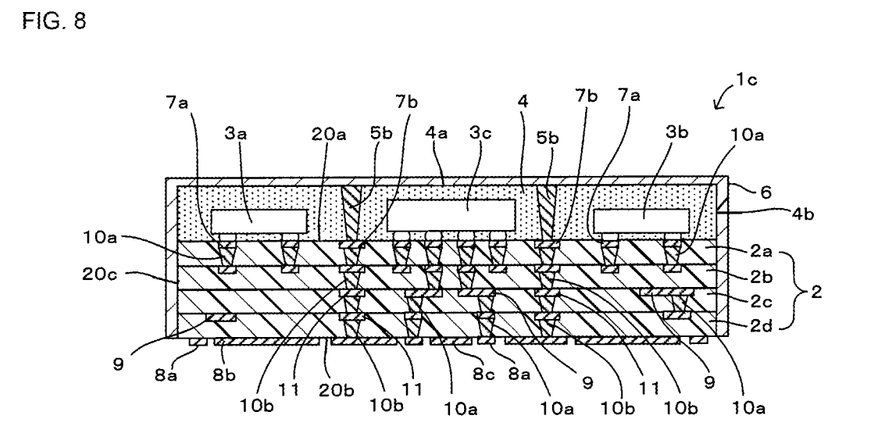
FIG. 8 is a sectional view of a high-frequency module according to a third embodiment of the present disclosure.
Figure 9:
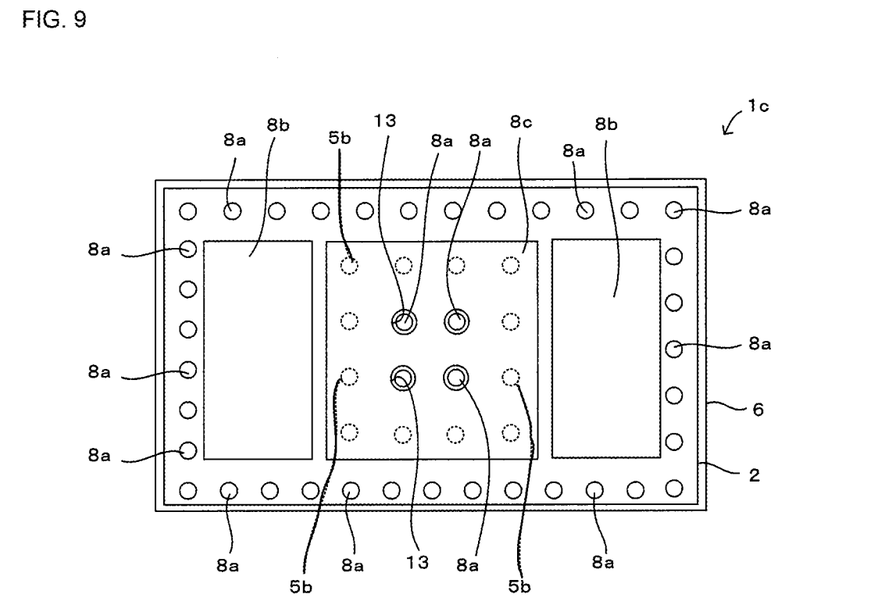
FIG. 9 is a bottom view of the high-frequency module illustrated in FIG. 8.

The differences between the high-frequency module 1c according to the third embodiment and the high-frequency module 1b according to the second embodiment that has been described with reference to FIG. 3 and FIG. 4 are, as illustrated in FIG. 8 and FIG. 9, the position of the component 3c that is surrounded by a shield, the structure of the shield, and the outer electrodes formed on the bottom surface 20b of the multilayer wiring board 2. The rest of the configuration of the high-frequency module 1c is the same as that of the high-frequency module 1b according to the second embodiment, and thus, the same reference signs will be used, and the description thereof will be omitted.

In this case, the component 3c that is to be shielded is disposed on a center portion of the top surface 20a of the multilayer wiring board 2. The plurality of via conductors 5b that form a portion of the shield surrounds the component 3c, the portion functioning as the shield between the components, are arranged so as to surround the component 3c (see FIG. 8 and FIG. 9). Note that, in this case, not only the four via conductors 5b that are arranged between the component 3c at the center and the component 3a on the left-hand side and the four via conductors 5b that are arranged between the component 3c at the center and the component 3b on the right-hand side, but also the rest of via conductors 5b that are not arranged between the components form a portion of a "shield member" according to the present disclosure.

The outer electrode 8c that is included in the shield surrounding the component 3c and that functions as a shield on the side on which the bottom surface 20b of the multilayer wiring board 2 is present is disposed on a center portion of the bottom surface 20b of the multilayer wiring board 2. In other words, when viewed in the direction perpendicular to the top surface 20a of the multilayer wiring board 2, the outer electrode 8c is disposed in a region that is surrounded by the plurality of via conductors 5b. In addition, similar to the second embodiment, the outer electrode 8c is formed so as to have an area larger than that of the component 3c such that the component 3c is fitted into the outer electrode 8c when viewed in the direction perpendicular to the top surface 20a of the multilayer wiring board 2. Furthermore, four openings 13 in which some of the outer electrodes 8a are to be positioned are formed in a center portion of the outer electrode 8c.

The plurality of connection conductors (the via conductors 10b and the pad electrodes 11) are arranged along the end edges of the outer electrode 8c when viewed in the direction perpendicular to the top surface 20a of the multilayer wiring board 2. Similar to the second embodiment, the upper end portions of the connection conductors are connected to specific mount electrodes 7b, and the lower end portions of the connection conductors are connected to the outer electrode 8c. Note that, in the present embodiment, unlike the other embodiments, the portion of the shield film 6 coating the side surface 4b of the sealing-resin layer 4 and the portion of the shield film 6 coating the side surface 20c of the multilayer wiring board 2 are not used as portions of the shield surrounding the component 3c. In other words, the shield surrounding the component 3c is formed of a portion of the shield film 6 that coats a portion of the top surface 4a of the sealing-resin layer 4, the plurality of via conductors 5b surrounding the component 3c, the plurality of connection conductors (the via conductors 10b and the pad electrodes 11), and the outer electrode 8c.

According to the present embodiment, the advantageous effects of the second embodiment can be obtained, and in addition, the shielding characteristics for the component 3c that is disposed on the center portion of the multilayer wiring board 2 can be improved.

(Modification of Internal Wiring Electrode)

Figure 10:
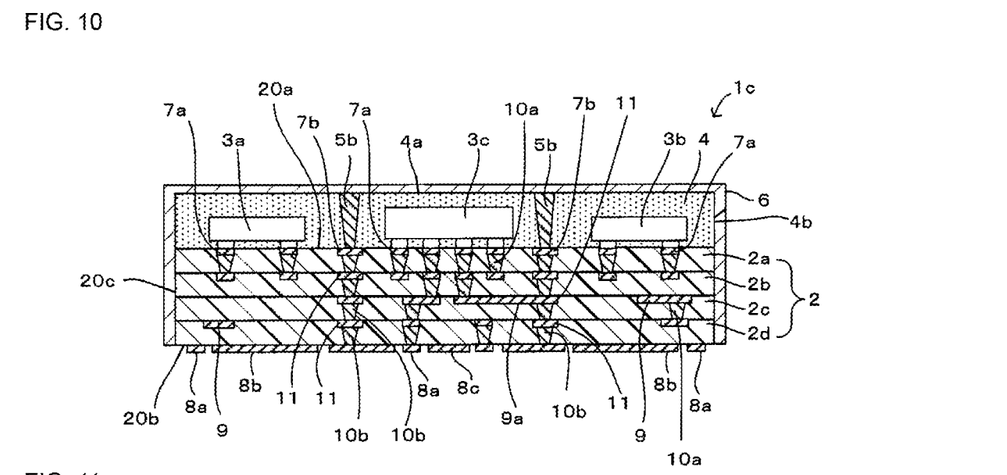
FIG. 10 is a diagram illustrating a modification of an internal wiring structure of the high-frequency module illustrated in FIG. 8.

As illustrated in FIG. 10, in the third embodiment, among signal lines of the component 3c that are formed in or on the multilayer wiring board 2, the grounding signal line may be connected to at least one of the connection conductors (the via conductors 10b and the pad electrodes 11). In this case, one of the internal wiring electrodes 9a that is included in the grounding signal line is connected to the pad electrode 11 of one of the connection conductors that is formed in or on the insulating layer 2c in or on which the internal wiring electrode 9a is also formed. With this configuration, it is not necessary to extend the grounding signal line of the component 3c to an outer electrode on the bottom surface 20b of the multilayer wiring board 2, and thus, the degree of freedom when designing the wiring lines in the multilayer wiring board 2 increases.

Fourth Embodiment

A high-frequency module 1d according to a fourth embodiment of the present disclosure will be described with reference to FIG. 11 and FIG. 12. Note that FIG. 11 is a sectional view of the high-frequency module 1d, and FIG. 12 is a bottom view of the high-frequency module 1d.

Figure 11:
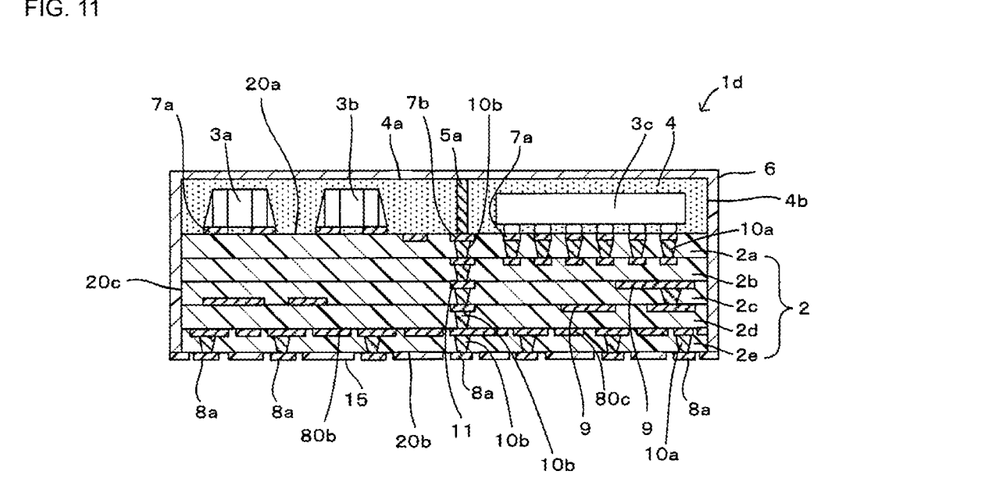
FIG. 11 is a sectional view of a high-frequency module according to a fourth embodiment of the present disclosure.
Figure 12:
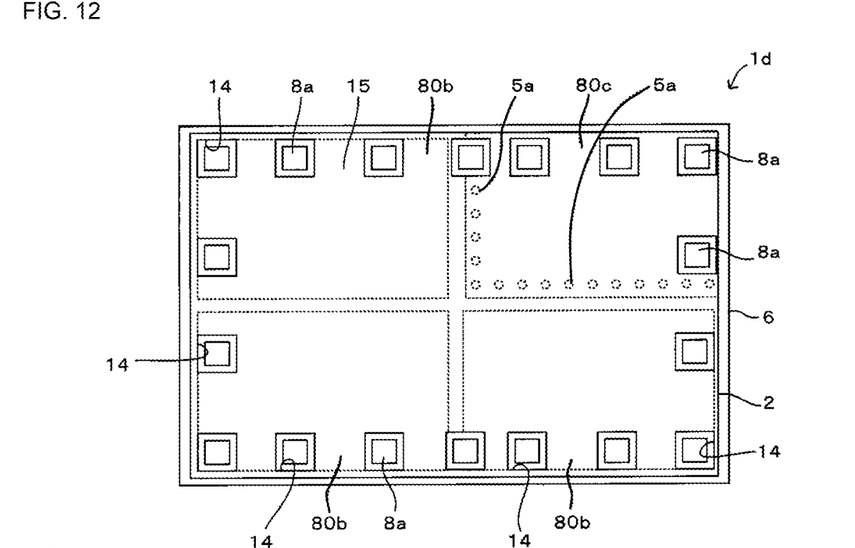
FIG. 12 is a bottom view of the high-frequency module illustrated in FIG. 11.

The differences between the high-frequency module 1d according to the fourth embodiment and the high-frequency module 1a according to the first embodiment that has been described with reference to FIG. 1 and FIG. 2 are, as illustrated in FIG. 11 and FIG. 12, the shield structure on the side on which the bottom surface 20b of the multilayer wiring board 2 is present and the number of layers of the multilayer wiring board 2. The rest of the configuration of the high-frequency module 1d is the same as that of the high-frequency module 1a according to the first embodiment, and thus, the same reference signs will be used, and the description thereof will be omitted.

In this case, the multilayer wiring board 2 is formed of five insulating layers 2a to 2e. In addition, instead of the outer electrodes 8b and 8c of the first embodiment, each of which is formed on the bottom surface 20b of the multilayer wiring board 2 and each of which functions as a shield on the side on which the bottom surface 20b is present, shield electrodes 80b and 80c are formed at positions that are in the multilayer wiring board 2 and that are close to the bottom surface 20b of the multilayer wiring board 2. Here, the shield electrode 80c that is one of the shield electrodes 80b and 80c and that overlaps with the component 3c when viewed in the direction perpendicular to the top surface 20a of the multilayer wiring board 2, serves as the outer electrode 8c of the first embodiment, and the component 3c is surrounded by the shield electrode 80c, the shield film 6, the plurality of metallic pins 5a, and the plurality of connection conductors (the via conductors 10b and the pad electrodes 11). An end edge of the shield electrode 80c is partially exposed at the side surface 20c of the multilayer wiring board 2 and is connected to the shield film 6. Note that the arrangement of the shield electrodes 80b and 80c at the positions close to the bottom surface 20b of the multilayer wiring board 2 refers to arranging the shield electrodes 80b and 80c at positions that are closer to the bottom surface 20b than the center of the multilayer wiring board 2 is in the thickness direction of the multilayer wiring board 2, and it is preferable that the shield electrodes 80b and 80c be arranged on the first or second layer above the bottom surface 20b. The center of the multilayer wiring board 2 refers to a position that is within the multilayer wiring board 2 and that is spaced apart from the top surface 20a and the bottom surface 20b by the same distance.

As illustrated in FIG. 12, the plurality of outer electrodes 8a are arranged on the bottom surface 20b of the multilayer wiring board 2 along the end edges of the bottom surface 20b. In addition, the bottom surface 20b of the multilayer wiring board 2 is coated with an insulating coating film 15 having openings 14 that are formed at positions where the outer electrodes 8a are arranged. The insulating coating film 15 can be made of, for example, a solder resist.

According to the present embodiment, in the configuration in which the shield electrode 80b and 80c, each of which functions as the shield on the side on which the bottom surface 20b of the multilayer wiring board 2 is present, are arranged within the multilayer wiring board 2, advantageous effects similar to those of the first embodiment can be obtained. In the case where the shield electrode 80b and 80c are arranged within the multilayer wiring board 2, the area of a shield region in the multilayer wiring board 2 is smaller than that in the first embodiment. However, by arranging the shield electrode 80b and 80c at positions that are close to the bottom surface 20b of the multilayer wiring board 2, in the multilayer wiring board 2, the area of a region in which the internal wiring electrodes 9 can be shielded can be increased.

Note that the present disclosure is not limited to the above-described embodiments, and various changes other than those described above can be made within the scope of the present disclosure. For example, the configurations according to the above-described embodiments and the above-described modifications may be combined with one another.

In addition, the number of layers of the insulating layers included in the multilayer wiring board 2 and the number of layers of the wiring layers included in the multilayer wiring board 2 may be suitably changed.

The present disclosure can be applied to various high-frequency modules each of which includes a sealing-resin layer that coats components mounted on a wiring board, a shield that coats a surface of the sealing-resin layer, and a shield that prevents mutual noise interference between the components.

1a to 1d high-frequency module
2 multilayer wiring board (wiring board)
3a to 3c component
4 sealing-resin layer
5a metallic pin (shield member)
5b via conductor (shield member)
5c shield wall (shield member)
6 shield film
8c outer electrode (shield electrode)
10b via conductor (connection conductor)
11 pad electrode (connection conductor)
80c shield electrode

The invention claimed is:

1. A high-frequency module comprising:
a wiring board;
a plurality of components mounted on a first main surface of the wiring board;
a sealing-resin layer sealing the first main surface of the wiring board and the plurality of components;
a shield member disposed in the sealing-resin layer so as to be located between one of the plurality of components and another one of the plurality of components;
a shield film coating a surface of the sealing-resin layer opposite to a surface of the sealing-resin layer being in contact with the wiring board, a side surface of the sealing-resin layer, and a side surface of the wiring board;
a shield electrode disposed at a position on or in a second main surface of the wiring board opposite to the first main surface of the wiring board, the position overlapping with the one component when viewed in a direction perpendicular to the first main surface of the wiring board; and
a plurality of connection conductors disposed in or on the wiring board and connecting the shield member and the shield electrode to each other,
wherein a first end of the shield member in a thickness direction of the wiring board is connected to the shield film, and a second end of the shield member in the thickness direction of the wiring board is connected to the first main surface of the wiring board, and
wherein the one component is surrounded by the shield film, the shield member, the shield electrode, and the plurality of connection conductors,
further having a signal electrode disposed on the second main surface of the wiring board.

2. The high-frequency module according to claim 1,
wherein a portion of an end edge of the shield electrode is located at an end edge of the second main surface of the wiring board so as to be connected to the shield film at the end edge of the second main surface of the wiring board,
wherein the shield member is disposed so as to surround the one component together with a portion of the shield film coating the side surface of the sealing-resin layer when viewed in the direction perpendicular to the first main surface of the wiring board, and
wherein the plurality of connection conductors are arranged along the shield member when viewed in the direction perpendicular to the first main surface of the wiring board.

3. The high-frequency module according to claim 1,
wherein the shield member is disposed so as to surround the one component when viewed in the direction perpendicular to the first main surface of the wiring board, and
wherein the shield electrode is disposed in a region overlapping with the one component when viewed in the direction perpendicular to the first main surface of the wiring board.

4. The high-frequency module according to claim 1, wherein the shield electrode is disposed in the wiring board so as to be positioned closer to the second main surface than a center of the wiring board is in the thickness direction of the wiring board.

\* \* \* \* \*